United States Patent [19]

Bynum et al.

[11] Patent Number: 4,665,459
[45] Date of Patent: May 12, 1987

[54] METHOD AND CIRCUIT FOR DISSIPATING STORED INDUCTIVE ENERGY

[75] Inventors: Byron G. Bynum; David L. Cave, both of Tempe, Ariz.

[73] Assignee: Motorola, Inc., Schaumburg, Ill.

[21] Appl. No.: 718,671

[22] Filed: Apr. 1, 1985

[51] Int. Cl.[4] ............ H02H 7/20; F02M 51/00; H03K 17/60

[52] U.S. Cl. ............ 361/91; 123/490; 307/255; 307/318; 307/252 C; 361/111

[58] Field of Search ............ 307/200 A, 318, 541, 307/544, 255, 252 C, 200 A; 361/159, 90, 91, 101; 123/644, 651, 652, 490; 323/289

[56] References Cited

U.S. PATENT DOCUMENTS

| | | | |
|---|---|---|---|
| 4,167,030 | 5/1979 | Heidt | 361/159 |
| 4,178,619 | 12/1979 | Seiler et al. | 307/318 |
| 4,359,652 | 11/1982 | Jarrett et al. | 307/363 |
| 4,484,244 | 11/1984 | Avery | 361/91 |
| 4,491,122 | 1/1985 | Piteo | 123/651 |

Primary Examiner—Stanley D. Miller
Assistant Examiner—B. P. Davis
Attorney, Agent, or Firm—Michael D. Bingham

[57] ABSTRACT

An integrated circuit comprising a series pass transistor for sourcing current from the positive side of a battery to an inductive load includes integrated circuitry for providing a direct current conduction path between ground and the inductive load as the series pass transistor is turned off by the battery being disconnected therefrom during normal operation so that the stored inductive energy of the inductive load is dissipated. The integrated circuitry includes a silicon controlled rectifier (SCR) coupled between the output of the integrated circuit and ground as well as a Zener diode coupled between the gate and anode of the SCR.

6 Claims, 2 Drawing Figures

METHOD AND CIRCUIT FOR DISSIPATING STORED INDUCTIVE ENERGY

BACKGROUND OF THE INVENTION

The present invention relates to dissipating stored energy in an inductive load and, more particularly, to dissipating stored inductive energy in an inductive load that is coupled to an integrated circuit system. Further, the invention pertains to safely dissipating the energy stored in an inductive load of an automotive integrated circuit system to prevent damage to the system under certain conditions.

Automotive systems such as window control systems, fuel injector systems, fuel pumps, etc. are comprised of solenoids or relays for controlling the operation of the particular system. The relays or solenoids may be driven or energized by an integrated control module circuit comprising semiconductor devices. The integrated control module circuit may include a PNP transistor connected in a series pass configuration between a source of operating potential (a battery) and the inductive load (a relay or solenoid). The turn-on and turn-off of the PNP transistor is controlled by internal control circuitry of the control module. Thus, the PNP transistor functions as a current switch for energizing and de-energizing the inductive load. Generally, these inductive loads are located distant from the integrated control module circuit although both are connected to a common electrical ground reference which may be the automotive chassis.

During operation, the inductive loads are driven from the positive side of the battery via the PNP transistor switch. As the PNP transistor is turned off, the inductive load will attempt to maintain the current flow therethrough as is understood. This condition causes a large negative voltage transient to occur at the collector of the series pass PNP transistor. In at least one prior art system an external discrete power Zener diode is connected between the positive battery supply and the collector of the series pass transistor. The Zener is rendered conductive in response to the negative transient voltage to provide a current conduction path to the inductive load as the series pass transistor turns off so that the stored energy of the load is dissipated whereby the integrated control module circuit is protected since the Zener limits the negative voltage to a non-destructive maximum level.

A problem with the above dissipation method and system is that the Zener diode must supply relative large currents to the inductive load in combination with a large voltage drop thereacross which means that the Zener must be a high power device. Thus, a large external discrete device is required in order to be capable of handling the power that must be dissipated. Additionally, state of the art power Zeners are relatively costly to the automotive manufacturer.

Another problem with prior art automotive systems using the Zener diode protection described above relates to reverse battery conditions. For instance, if the battery of the automobile is connected in reverse, i.e., the negative and positive terminals being reversed, a negative potential is supplied to the control module and the zener. This condition causes the Zener to be forward biased to provide a direct current conduction path to the inductive load. If the inductive load is, for example, a relay it will be energized since most, if not all, relays are bilateral, i.e., they are energized by current flowing in any direction. This is a very undesirable condition as the relay may drive a fuel pump that would therefore be continuously operated as the battery is connected in reverse. This problem is sometimes solved in prior art systems by the addition of a diode in series with the Zener to block conduction during reverse battery conditions. This solution adds another component which is costly to the manufacturer.

In addition to the above described reverse battery condition, the automatic integrated control module must also withstand other abnormal conditions such as the loss of the positive battery connection or the loss of the ground connection during the time that the inductive load is energized. Some prior art protection means such as the Zener or Zener plus diode methods described above, do not provide a conduction path for the inductively stored energy for both of these abnormal conditions. Thus, the high negative voltage that develops across the inductive load can exceed the destructive level of the integrated circuitry within the control module.

Hence, there exists a need for an improved and inexpensive system for dissipating stored inductive energy in an inductive load coupled to an integrated circuit, especially when such integrated circuit is utilized in the automotive environment.

SUMMARY OF THE INVENTION

Accordingly, it is an object of the present invention to provide an improved method and circuit for dissipating stored inductive energy.

Another object of the present invention is to provide a method for dissipating stored inductive energy in an inductive load of an automotive system.

Still another object of the present invention is to provide a circuit for dissipating stored inductive energy in an automotive system.

A further object of the present invention is to provide an integrated circuit including circuitry for dissipating stored inductive energy of an inductive load connected to the integrated circuit.

In accordance with the above and other objects, there is provided a method for dissipating stored inductive energy in an inductive load if there is a loss of the positive voltage source connection that provides power to the load while the load is energized, comprising the steps of providing a direct current conduction path from ground reference to the inductive load when the positive voltage connection is lost and inhibiting the current conduction path from ground if the positive potential source connection is not lost.

It is one aspect of the invention to provide a source of energizing current to an inductive load from a positive potential source through a series pass transistor of an integrated circuit wherein the inductive load is turned off by rendering the transistor non-conductive. If the positive potential is disconnected to the series pass transistor while the inductive load is energized the stored inductive energy in the inductive load is dissipated by coupling a silicon controlled rectifier circuit in parallel to the inductive load to provide a direct current conduction path thereto when the silicon controlled rectifier circuitry is turned on by the voltage induced across the inductive load going negative as the series pass transistor is turned off.

Another aspect of the invention is to provide a method of dissipating stored inductive energy during normal conditions of turning off the load (i.e. the positive potential source remains connected) comprising means to cause the PNP pass transistor to become conductive in response to the voltage increase thereacross due to the inductive load voltage going negative.

DETAILED DESCRIPTION OF THE PREFERRED EMBODIMENT

Figure 1:
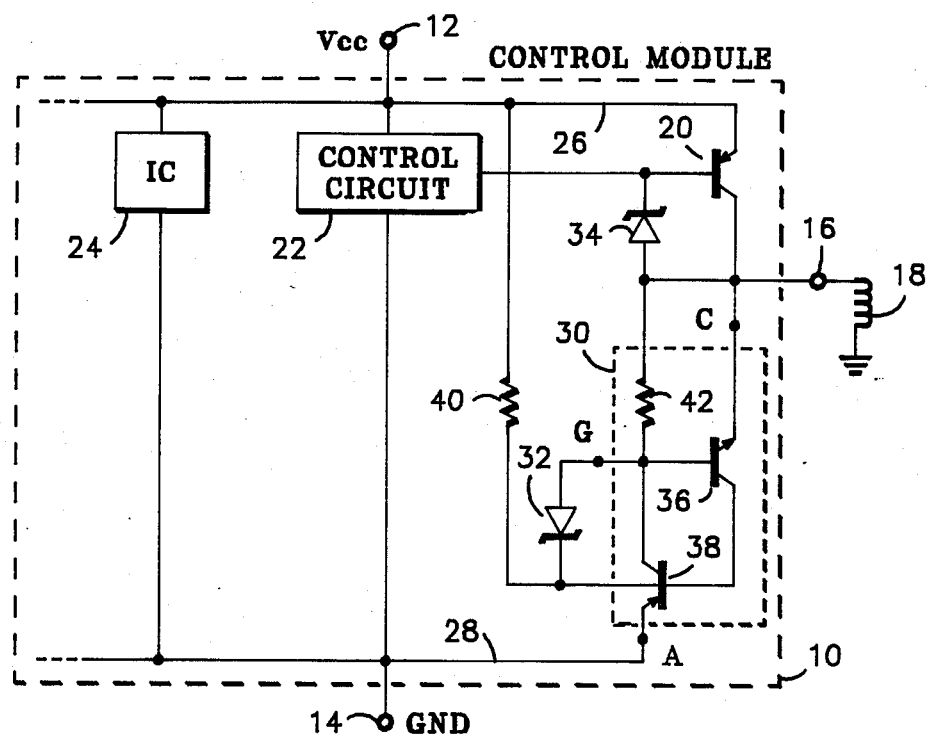
FIG. 1 is a partial block and schematic diagram illustrating the present invention.
Figure 2:
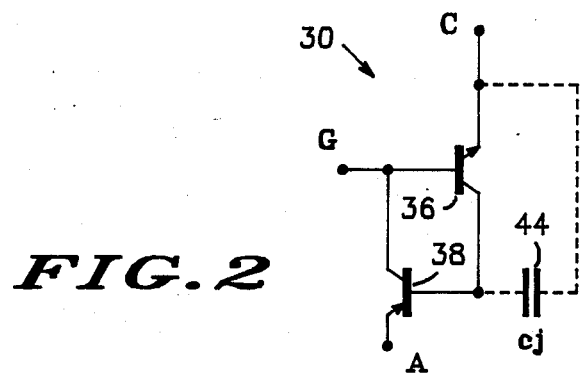
FIG. 2 is a schematic representation of an integrated silicon controlled rectifier of the present invention.

Turning to the FIGURES, there is shown a common type control module within dashed outline 10 including circuitry of the present invention for dissipating stored inductive energy. Control module 10 may be manufactured in monolithic integrated circuit form and includes external pins 12, 14 and 16. If used in an automotive system, integrated control module circuit 10 would be connected through pins 12 and 14 to the battery positive terminal and chassis ground respectively of the automobile. Control module 10 is coupled at output pin 16 to an external inductive load 18 (symbolized by the inductor) that is driven from the high side (positive) of the automobile battery through PNP transistor 20. Inductive load 18 may be, for example, a relay or solenoid in the automotive system that is energized by control module 10. PNP transistor 20 is generally a high breakdown device that has its emitter- collector path coupled via power supply conductor 26 between the battery which provides a source of operating potential VCC and output 16 to inductive load 18. The conductivity of transistor 20 is controlled by control circuit 22 connected between VCC and ground by connection between power supply conductors 26 and 28. Other integrated circuitry may be included in control module 10 as represented by integrated circuit 24 shown coupled between power supply conductors 26 and 28. An example of a circuit including a series pass transistor such as transistor 20 and control circuitry is disclosed and described in U.S. patent application Ser. No. 453,402 the teaching of which are incorporated herein by reference made thereto.

When series pass transistor 20 is rendered conductive by control circuit 22, current is sourced to output terminal 16 which causes inductive load 18 to be energized to operate the particular automotive system. When transistor 20 is rendered nonconductive the energy stored in inductive load 18 must be dissipated. As understood, when transistor 20 is turned off, inductive load 18 attempts to maintain the current flowing therethrough. This results in a large negative voltage appearing at the top of inductive load 18 that is applied to the collector of transistor 20. If a current conduction path is not provided to dissipate the stored inductive energy, this negative voltage can damage or destroy the integrated circuitry comprising control module 10. As previously mentioned, a discrete power Zener has been used in the prior art which is connected between VCC and pin 16 in a manner such that the Zener is rendered conductive in response to the negative voltage appearing at pin 16 to provide a current conduction path from VCC through conductive load 18.

However, the use of the Zener diode mentioned above is undesirable for several reasons. Besides being relatively expensive, a forward conduction path is provided through the Zener that will energize inductive load 18 if VCC should go negative by, for example, the battery terminals being connected backwards between power supply conductors 26 and 28. Also, if VCC is disconnected while inductive load 18 is energized by, for example, the battery line being disconnected there is no conduction path to dissipate the stored energy in inductive load 18 as it is subsequently turned off by transistor 20 being rendered non-conductive.

To overcome the aforementioned problems, stored inductive energy dissipating circuitry is provided in accordance with the present invention within control module 10 which includes a silicon controlled rectifier (SCR) 30 shown having its cathode and anode coupled between output pin 16 and power supply conductor 28, respectively, and its gate coupled to the anode of Zener diode 32, the cathode of which is coupled to power supply conductor 28 through the base-emitter connection of transistor 38. In addition, a second Zener diode 34 is coupled between the base or control electrode of transistor 20 and output pin 16. SCR 30 is shown schematically as comprising NPN and PNP transistors 36 and 38 as is well known. A pre-charging resistor 40 is connected between power supply conductor 26 and the interconnected base and collector electrodes of PNP transistor 38 and NPN transistor 36 respectively. Resistor 40 is used to pre-charge junction capacitor 44 which is formed by the parasitic capacitance between the epitaxial layer and the substrate of integrated control module circuit 10. By pre-charging capacitance 44 false triggering of SCR 30 is inhibited under certain conditions as will be explained hereinafter. Resistor 42 sets the minimum holding current of SCR 30 and reduces the sensitivity of SCR 30 to rapid changes in the voltage across load 18 as is understood.

In normal operation, when transistor 20 is turned off to inhibit drive to the load, the voltage on inductive load 18 goes negative with respective to the voltage that was developed thereacross when it was energized. As the magnitude of this negative going voltage reaches a value equal to VCC minus the breakdown voltage of Zener diode 34 plus one $V_{BE}$ (where $V_{BE}$ is the base emitter voltage of transistor 20) Zener 34 is forward biased which turns on transistor 20 whereby the stored energy is dissipated in inductive load 18 as a direct current conduction path is provided. Thus, as long as the breakdown voltage of Zener 34 is made equal to or less than the breakdown voltage of Zener 32 by a predetermined value, and as long as an operating potential VCC is supplied to control module 10, during normal operation, Zener 32 and SCR 30 will never conduct.

However, if inductive load 18 is energized, via transistor 20, and if VCC is disconnected, control module 10 could be otherwise damaged since there would then be no direct current conduction path to dissipate the stored energy in the inductive load. If this condition should occur, Zener 32 is rendered conductive when the voltage across inductive load 18 decreases in a negative sense until a voltage equal to the breakdown voltage of Zener 32 plus the base-emitter voltage of transistor 36 is reached. At this value, SCR 30 is fired and a direct current path is provided from ground, through the SCR to output 16 and the load to dissipate the stored energy. Once SCR 30 fires the voltage across it drops to a low value as is understood reducing the SCR power requirements. Hence, under normal operating conditions, a current conduction path via Zener 34 and transistor 20 is provided to dissipate the stored inductive energy in inductive load 18 whenever transistor 20 is rendered non-conductive. Moreover, a direct current conduction path is provided via SCR 30 to dissipate the load energy if VCC is lost or disconnected while load 18 is energized. In addition, no path for current conduction to inductive load 18 is available if the battery terminals should be reversed. Hence, control module 10 of the present invention prevents inductive load 18 from being energized if a minus voltage is applied at pin 12. Further, the reduced power requirements for SCR 30 permits minimal die area to be used for integrating SCR 30 on the integrated circuit. Furthermore, Zener diodes 32 and 34 are low power devices having minimal space requirements.

Pre-charging resistor 40 prevents SCR 30 from false triggering during conditions where ground reference is lost at pin 14 or where a very high rate of negative voltage change (dv/dt) occurs at output 16. If ground is lost for some reason during normal operation, parasitic capacitance 44 could otherwise provide current flow as power supply conductor 28 becomes positive as current is conducted through the integrated circuitry of the control module such that this power supply conductor begins to approach the voltage VCC. This could cause SCR 30 to fire absent pre-charging of capacitor 44 to VCC by resistor 40. Thus, by biasing capacitor 44 to VCC, SCR 30 cannot fire until ground potential goes above VCC which is not possible during loss of ground. Resistor 40 also greatly desensitizes SCR30 to false triggering due to high dv/dt at output 16 by causing the magnitude of dv/dt induced current in capacitor 44 to exceed $V_{CC}/R_{40}$ before PNP38 could be rendered conductive and firing SCR 30.

The SCR technique does not protect the other integrated circuits such as integrated circuit 24 if the load is turned off during a loss of ground. If inductive load 18 is turned off while there is a loss of ground, protection is provided control module 10 by Zener diode 34. The use of Zener diode 34 connected between base and collector electrodes of transistor 20 is much improved over utilization of a discrete power Zener connected between VCC and pin 16 in that only the small base current of transistor 20 is utilized which is conducted through Zener diode 34 as it is rendered conductive by the resulting negative voltage appearing at pin 16.

Hence, what has been described above, is a novel combination of a series pass power transistor, Zener diodes, a resistor and an SCR to dissipate stored inductive energy in an automotive system. Additionally, the disclosed method and circuit for dissipating the stored inductive energy does not allow the inductive load coupled to the system to be energized during loss of ground or reverse battery conditions. Further, the control module driving the inductive load is protected if either positive battery or ground connections or opened during the operation of the automotive system.

We claim:

1. An integrated control circuit for driving an inductive load coupled thereto, the integrated control circuit including a series pass transistor adapted to be coupled between an external source of operating potential and an output of the integrated control circuit for sourcing current to the inductive load, comprising:

first and second power supply conductors, said first power supply conductor being adapted to receive the operating potential, said second power supply conductor being adapted to receive a ground potential;

circuit means coupled between said second power supply conductor and the output of the integrated control circuit for providing both a direct current conduction path to the inductive load whenever said circuit means is rendered operative in response to the transistor being turned off by the operating potential being disconnected from said first power supply conductor while the series pass transistor is driving the inductive load and inhibiting said direct current conduction path during normal circuit operating conditions, said circuit means including a silicon controlled rectifier (SCR) having first and second electrodes coupled between said second power supply conductor and the output of the integrated control circuit, and a control electrode, wherein said SCR includes a first transistor formed in the integrated control circuit having first, second and control electrodes, said first electrode being connected to the output of the integrated control circuit, a second transistor formed in the integrated control circuit having first, second and control electrodes, said first and second electrodes being connected to said second power supply conductor and said control electrode of said first transistor respectively, said control electrode being connected to said second electrode of said first transistor;

diode means coupled between said second and control electrodes of said second transistor;

an additional diode means connected between a control electrode of the series pass transistor and the output of the control circuit; and resistive means coupled between the first power supply conductor and said control electrode of said second transistor.

2. The integrated control circuit of claim 1 wherein said diode means and said additional diode means are Zener diodes.

3. An automotive system including an inductive load, an integrated control module circuit coupled between a source of operating potential and ground and including a series pass transistor switch for sourcing current to the inductive load when rendered conductive, the transistor being adapted to receive the operating potential, the improvement comprising said integrated control module circuit including circuit means for dissipating the stored inductive energy in the inductive load as the series pass transistor switch is rendered nonconductive if the operating potential is disconnected from the integrated control module, said circuit means including a silicon controlled rectifier connected between ground and the output for providing a current conduction path to the inductive load when the series pass transistor switch is rendered nonconductive by said disconnection of the operating potential, said silicon controlled rectifier (SCR) having a control electrode, and diode means coupled between said control electrode of said (SCR) and ground, wherein said SCR is formed by a first transistor having first, second and control electrodes, said first electrode being coupled to the output of the integrated control module circuit, and a second transistor having first, second and control electrodes, said first electrode being coupled to ground, said second electrode being coupled to said control electrode of said first transistor, said control electrode being connected to said second electrode of said first transistor; additional diode means coupled between a control electrode of the transistor switch and the output of the integrated control module circuit; and resistive means coupled between a source of operating potential and said control electrode of said second transistor.

4. The automotive system of claim 3 wherein said diode means and said additional diode means are Zener diodes.

5. In an integrated circuit including a series pass transistor for sourcing current between a source of operating potential supplied to the integrated circuit and an output thereof to which is connected a load, the integrated circuit including an input at which a ground reference potential is supplied, the integrated circuit comprising:
- a silicon controlled rectifier having anode, cathode and gage electrodes, said cathode and anode electrodes being coupled respectively between the output and the input of the integrated circuit; and
- diode means couple between said gate of said silicon controlled rectifier and the input for rendering the silicon controlled rectifier conductive when the voltage at the output of the integrated circuit exceeds a predetermined negative value such that a direct current conduction path is provided between the input and the output to the load; and
- additional diode means coupled between the base of the series pass transistor and said gate electrode of said silicon controlled rectifier to inhibit said silicon controlled rectifier being rendered conductive whenever said output voltage does not exceed said predetermined negative value.

6. In a high side driver circuit including a series pass transistor having its emitter-collector conduction path coupled between a source of operating potential and an output of the circuit for driving a load and control circuitry coupled to the base of the transistor for selectively turning on and off the transistor, the improvement comprising:
- a silicon controlled rectifier (SCR) having its anode and cathode coupled respectively between a power supply conductor to which is supplied ground reference potential and the output of the circuit;
- first diode means coupled between the gate of said SCR and said power supply conductor, said SCR and first diode means being rendered conductive in response to the voltage at the output of the circuit exceeding a first predetermined negative value to provide a direct current (dc) conduction path between said power supply conductor and the output; and
- second diode means coupled between the base of the series pass transistor and the output of the circuit for providing a dc conduction path between the output and the operating potential via the base-emitter conduction path of the transistor whenever said output voltage exceeds a second predetermined negative value which is less than said first predetermined value to inhibit said SCR from being rendered conductive as the series pass transistor is selectively turned off in response to the control circuitry.

* * * * *